US008428525B2

(12) United States Patent
Bai (10) Patent No.: US 8,428,525 B2
(45) Date of Patent: Apr. 23, 2013

(54) PREDISTORTER FOR A MULTI-ANTENNA TRANSMITTER

(75) Inventor: Chunlong Bai, Kanata (CA)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 27 days.

(21) Appl. No.: 13/155,527

(22) Filed: Jun. 8, 2011

(65) Prior Publication Data

US 2012/0313700 A1 Dec. 13, 2012

(51) Int. Cl.
*H04B 1/04* (2006.01)

(52) U.S. Cl.
USPC ................... 455/114.3; 455/63.1; 455/67.13

(58) Field of Classification Search ............... 455/114.3, 455/63.1, 67.13, 69, 13.3, 500, 103, 91, 114.2, 455/115.1, 127.3; 370/208; 375/267, 296, 375/225, 260, 285, 269, 281; 341/110, 118; 330/124 R
See application file for complete search history.

(56) References Cited

U.S. PATENT DOCUMENTS

| 5,917,373 | A * | 6/1999 | Twitchell ................... 330/149 |
| 6,222,878 | B1 * | 4/2001 | McCallister et al. ......... 375/225 |
| 7,469,491 | B2 * | 12/2008 | McCallister et al. ......... 375/296 |
| 2005/0219089 | A1 * | 10/2005 | Batruni ........................ 341/118 |
| 2006/0067426 | A1 * | 3/2006 | Maltsev et al. ................ 375/297 |
| 2009/0129257 | A1 * | 5/2009 | Maltsev et al. ................ 370/208 |
| 2010/0159837 | A1 * | 6/2010 | Dent et al. .................... 455/63.1 |
| 2010/0202563 | A1 | 8/2010 | Yan et al. |
| 2010/0316157 | A1 * | 12/2010 | Bassam et al. ................ 375/267 |

OTHER PUBLICATIONS

Bassam, S.A. et al., "Crossover Digital Predistorter for the Compensation of Crosstalk and Nonlinearity in MIMO Transmitters", IEEE Transactions on Microwave Theory and Techniques, IEEE Service Center, Piscataway, NJ, US., vol. 57, No. 5, May 1, 2009.
PCT Search Report Corresponding to PCT/IB2012/051674.
Crossover Digital Predistorter for the Compensatioin of Crosstalk and Nonlinearity in Mimio Transmitters by Seyed Aidin Bassam et al, 2009.

* cited by examiner

*Primary Examiner* — Pablo Tran
(74) *Attorney, Agent, or Firm* — Alex Nicolaescu; Ericsson Canada Inc.

(57) ABSTRACT

Methods and apparatus are disclosed for predistorting input data signals to a MIMO transmitter to compensate for distortions introduced by the MIMO transmitter. Distortions introduced to data signals by a MIMO transmitter include crosstalk between multiple transmit paths and non-linearities introduced by power amplifiers. In an exemplary predistorter, post-amplifier crosstalk is compensated for by a first matrix operation before distortions introduced by power amplifiers are predistorted by power amplifier predistorters. After the power amplifier predistorters, pre-amplifier crosstalk is compensated for by a second matrix operation.

8 Claims, 5 Drawing Sheets

PREDISTORTER FOR A MULTI-ANTENNA TRANSMITTER

TECHNICAL FIELD

The present invention relates generally to techniques for correcting signal distortions in a multi-antenna transmitter.

BACKGROUND

Modern wireless communication networks achieve high data rates by adopting advanced modulation schemes and employing multiple-input-multiple-output (MIMO) antenna systems. While such technologies are successful in achieving high spectrum efficiencies, they pose new challenges to multi-antenna transmitter design.

For example, high order modulation schemes, such as 16 QAM modulation or 64 QAM modulation, result in a transmit signal with a high Peak-to-Average Power Ratio (PAPR). Orthogonal frequency-division multiplexing (OFDM) techniques used by MIMO antenna systems also result in a signal with a high PAPR. One consequence of a high PAPR is that the power amplifier (PA) must meet stricter linearity requirements to avoid spectrum re-growth, especially when the transmit power is high. Power amplifiers typically operate most efficiently at or near the saturation point. However, the response of the power amplifier at or near saturation point is non-linear. Therefore, there is a trade-off between greater efficiency and linearity.

MIMO systems employ multiple antennas at the transmitter and receiver to transmit and receive information. By exploiting the spatial dimension of the communication channel between the transmitting terminal and the receiving terminal, MIMO communication systems can simultaneously transmit multiple data streams from a transmitting terminal to one or more receiving terminals over the same carrier frequency. Thus, MIMO communication systems achieve higher spectral efficiency and higher data rates without increasing bandwidth. One problem encountered in MIMO transmitters is crosstalk between the transmit paths, especially when multiple transmit paths are integrated in a limited area on the same chipset. Crosstalk affects transmit signal quality, which can be measured by adjacent channel power ratio or error vector magnitude. Crosstalk also affects received signal quality.

One way to improve a power amplifier's efficiency and its overall linearity is to digitally predistort the input signal to the power amplifier to compensate for the distortion introduced by the power amplifier. In effect, the input signal is adjusted in anticipation of the distortion to be introduced by the power amplifier, so that the amplifier output signal is largely free of distortion. Generally, the predistortion is applied to the signal digitally before the signal is up-converted to radio frequencies.

Some known techniques are also useful in reducing crosstalk. They include buffering local oscillator paths, installing grounded guard rings, and using a deep trench, a porous silicon trench, a silicon-on-insulator substrate, or a high-resistivity substrate obtained by proton bombardment. However, these techniques do not eliminate crosstalk completely.

Article *Crossover Digital Predistorter for the Compensation of Crosstalk and Nonlinearity in MIMO Transmitters*, IEEE Transactions on Microwave Theory and Techniques, Vol. 57, No. 5, May 2009, describes a digital crossover predistorter that uses a combined mathematical model for both crosstalk and power amplifier distortions. Such crossover predistorters can be beneficial in improving the overall performance of a transmitter system in terms of both linearity and efficiency. However, the structure of the crossover predistorters can become complex as the number of transmit paths increases. The crossover predistorters become impractical in situations where the number of transmit paths becomes large because the complexity of the digital predistorter increases quadratically with the number of RF transmit paths. In a MIMO transmitter that comprises 4 or 8 RF paths, a crossover predistorter that models both crosstalk and PA distortions as proposed in the above-mentioned article is 8 or 32 times more complex than modeling PA distortions alone.

SUMMARY

The present invention provides methods and apparatus for correcting distortions in data streams transmitted from a multi-antenna transmitter. In a multi-antenna transmitter, multiple data streams are fed through different transmit paths to respective transmit antennas. The data stream on each transmit path is amplified by a respective power amplifier. A low complexity digital predistorter is used to compensate for both crosstalk between the different transmit paths and for distortions introduced by the power amplifiers.

Exemplary embodiments of the invention comprise methods implemented in a multi-antenna transmitter for correcting distortions introduced during transmission. The multi-antenna transmitter includes a plurality of transmit paths coupled to respective transmit antennas. Each transmit path includes a power amplifier for amplifying the data stream being transmitted from a respective antenna. The data streams are initially predistorted to compensate for post-amplifier crosstalk between the different transmit paths occurring after the power amplifiers. After compensating for post-amplifier crosstalk, the data streams are then predistorted to compensate for non-linear distortions introduced by the power amplifiers. After the non-linear distortions of the power amplifiers have been compensated for, the data streams are predistorted to compensate for pre-amplifier crosstalk between the different transmit paths occurring before the amplifiers. The predistorted data streams are then fed into a MIMO transmitter for transmission.

An exemplary apparatus according to the present invention comprises a predistortion circuit for predistorting signals transmitted by a multi-antenna transmitter. The multi-antenna transmitter includes a plurality of transmit paths coupled to respective transmit antennas. Each transmit path includes a power amplifier for amplifying the data stream being transmitted from a respective antenna. The predistortion circuit according to one embodiment comprises a first crosstalk predistorter, one or more power amplifier predistorters, and a second crosstalk predistorter. The first crosstalk predistorter is configured to compensate the input data streams for the crosstalk between the transmit paths introduced after the amplifiers. The power amplifier predistorters operate on the output data streams from the first crosstalk predistorter and predistort the data signals to compensate for the distortions introduced in the power amplifiers. The second crosstalk predistorter is configured to compensate the output data streams from the power amplifier predistorters for the crosstalk between the transmit paths introduced before the power amplifiers.

DETAILED DESCRIPTION

In an exemplary embodiment, a digital predistorter is used to predistort data signals to compensate for both crosstalk between multiple transmit paths and non-linear distortions introduced by power amplifiers before the data signals enter the RF components of a MIMO transmitter. The exemplary digital predistorter comprises two separate "matrix blocks" to compensate for crosstalk between the different transmit paths and a plurality of parallel power amplifier (PA) predistorters between the two matrix blocks. The data streams are initially input to a first matrix block that compensates for crosstalk between the different transmit paths occurring after the power amplifiers (post-amplifier crosstalk). The data streams output from the first matrix block are applied to respective power amplifier predistorters, which compensate for the distortions introduced by the power amplifiers. Finally, the signal output from the power amplifier predistorters are fed to the second matrix block to compensate for crosstalk between the different transmit paths occurring before the power amplifiers (pre-amplifier crosstalk).

Figure 1:
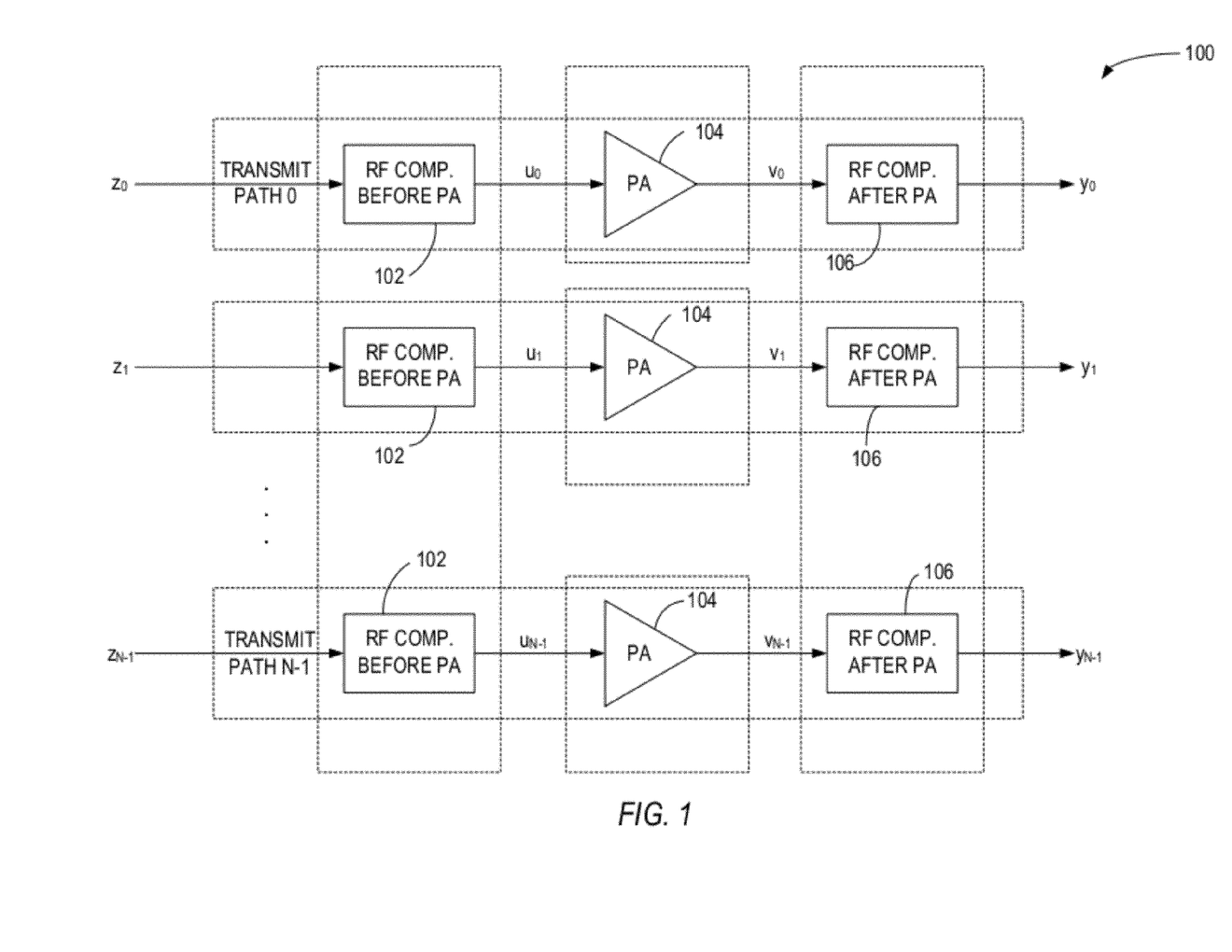
FIG. 1 illustrates a MIMO transmitter with multiple transmit paths.

FIG. 1 illustrates a MIMO transmitter 100. MIMO transmitter 100 has a plurality of transmit paths coupled to respective transmit antennas. Each transmit path receives an input data stream $z_i$ and outputs an output data stream $y_i$ to be transmitted by its respective antenna. Each transmit path i comprises pre-amplifier RF components 102, a power amplifier 104, and post-amplifier RF components 106. Pre-amplifier RF components 102 often include a modulator, a filter, and an up-converter (not shown) and are represented by one single block 102. Post-amplifier RF components 106 often include a duplexer, switch, and/or isolater (not shown) and are represented by one single block 106. The transmit paths and the power amplifiers 104 are typically integrated within a limited area inside a chipset. Consequently, as the data streams pass through MIMO transmitter 100, they are affected by distortions that include interference between the radio frequency signals on different transmit paths, known as crosstalk, and non-linear distortions introduced by power amplifiers.

Figure 2:
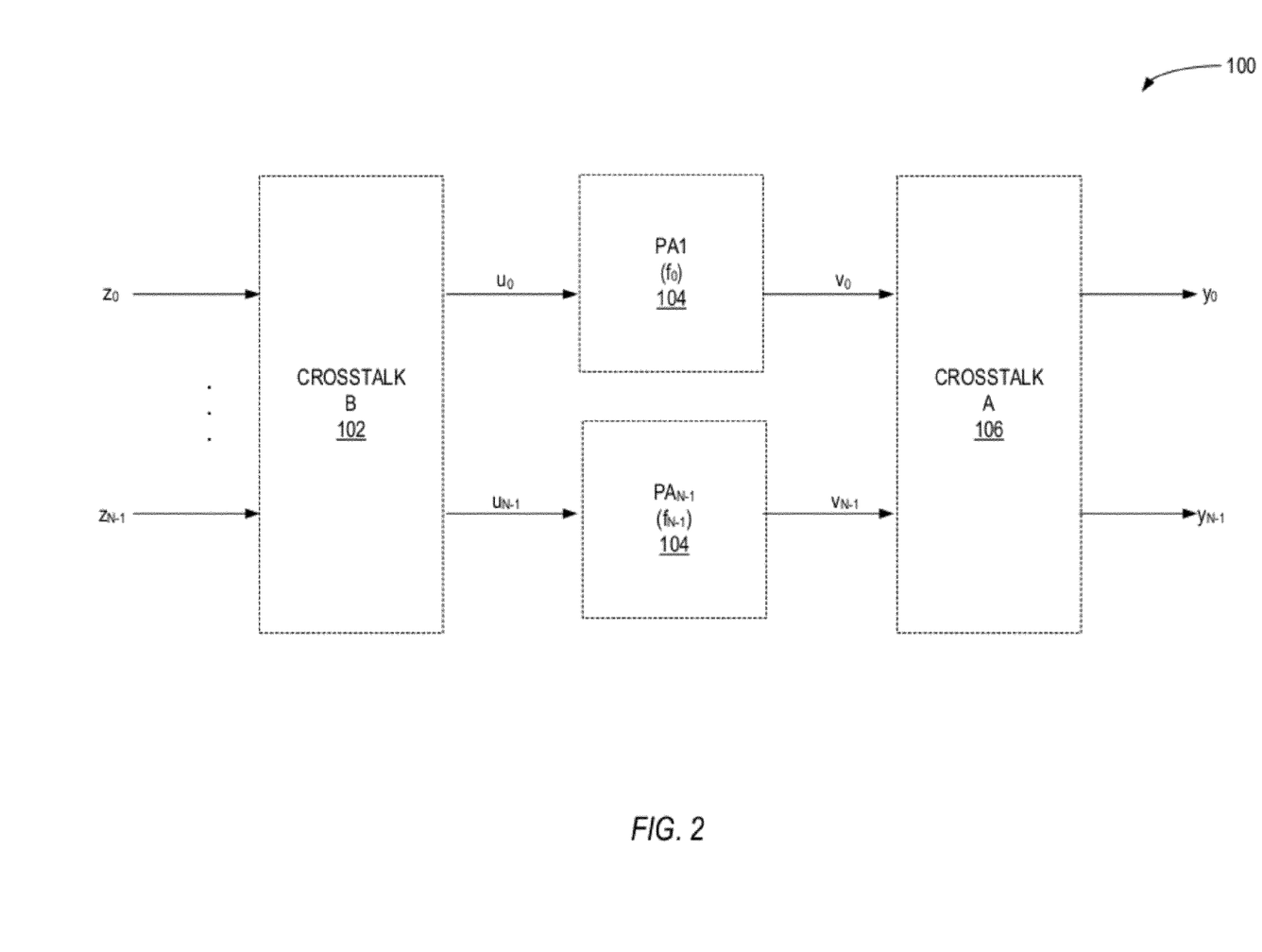
FIG. 2 illustrates a block diagram showing different distortions present in a MIMO transmitter.

FIG. 2 illustrates the different distortions experienced by the data streams within MIMO transmitter 100. In FIG. 2, MIMO transmitter 100 receives N input data streams $z = [z_0, z_1, \ldots, z_{N-1}]^T$ and outputs N data streams $y = [y_0, y_1, \ldots, y_{N-1}]^T$. Output data streams y is related to z as:

$$y = \Gamma(z) \quad (1.1),$$

where $\Gamma$ is a function representing the gain and distortions MIMO transmitter 100 introduces on the input data streams z. $\Gamma$ reflects both crosstalk between the multiple transmit paths and non-linearities introduced by the power amplifiers.

In FIG. 2, distortions due to crosstalk are represented by matrices B and A. Matrix B represents pre-amplifier crosstalk and matrix A represents post-amplifier crosstalk. The non-linear effects introduced by each power amplifier $PA_1$, $PA_2 \ldots PA_{N-1}$ are modeled individually by functions $f_0$, respectively. The impairments the input data streams $z_0$, $z_1 \ldots z_{N-1}$ experience as they pass through the RF components of the MIMO transmitter can be modeled mathematically as follows.

For pre-amplifier crosstalk effects, input data streams z are converted into output data streams u after passing through the pre-amplifier RF components 102:

$$\underset{N \times 1}{u} = \underset{N \times N}{B} \cdot \underset{N \times 1}{z}. \quad (1.2)$$

In Equation (1.2), z is an N×1 vector and represents the input data streams. u is an N×1 vector and represents the data streams entering power amplifiers 104, and B is an N×N matrix that represents pre-amplifier crosstalk and can be expressed as:

$$B = \begin{pmatrix} b_{0,0} & \cdots & b_{0,N-1} \\ \vdots & \ddots & \vdots \\ b_{N-1,0} & \cdots & b_{N-1,N-1} \end{pmatrix}. \quad (1.3)$$

The non-linear impairments introduced by each power amplifier are modeled by:

$$v_i = f_i(u_i) \quad (1.4),$$

where $f_i$ is a non-linear function, $v_i$ represents the output data stream from the power amplifier on the i-th transmit path, $u_i$ is the data stream on the i-th transmit path entering the power amplifier for i=0, 1, ..., N−1. Expressed in a vector form, signal v relates to u according to:

$$v = f(u) \quad (1.5),$$

where $v = [v_0, v_1, \ldots, v_{N-1}]^T$, $u = [u_0, u_1, \ldots, u_{N-1}]^T$ and f is an array of functions with each element representing the distortion introduced by each power amplifier:

$$f = \begin{pmatrix} f_0 \\ \vdots \\ f_{N-1} \end{pmatrix}. \quad (1.6)$$

In Equation (1.6), $f_i$ represents the distortion function of $PA_i$. The post-amplifier crosstalk effects are modeled by:

$$\underset{N \times 1}{y} = \underset{N \times N}{A} \cdot \underset{N \times 1}{v}, \quad (1.7)$$

where matrix A represents post-amplifier crosstalk and can be expressed as:

$$A = \begin{pmatrix} a_{0,1} & \cdots & a_{0,N-1} \\ \vdots & \ddots & \vdots \\ a_{N-1,0} & \cdots & a_{N-1,N-1} \end{pmatrix}. \quad (1.8)$$

As shown in FIG. 2, with the distortions introduced by MIMO transmitter 100, the data streams to be transmitted from the antennas, $y_0, y_1 \ldots, y_{N-1}$, are no longer the same as the input data signal $z_0, z_1 \ldots z_{N-1}$. They are related to each other as:

$$\underset{N \times 1}{y} = \underset{N \times N}{A} \cdot f\left(\underset{N \times N}{B} \cdot \underset{N \times 1}{z}\right). \quad (1.9)$$

Comparing Equation (1.9) with Equation (1.1), we can express $\Gamma$ as:

$$\Gamma = A \cdot f(B).$$

In an ideal transmitter where there were no distortion and crosstalk, signal y would be linearly related to signal z as:

$$\underset{N \times 1}{y} = \underset{N \times N}{diag(g)} \cdot \underset{N \times 1}{z}, \quad (1.10)$$

where g is an N×1 gain vector $[g_0, g_1, \ldots, g_{N-1}]^T$ with each element $g_i$ representing the desired gain of the data signal on the i-th transmit path.

In practice, output signal y of MIMO transmitter 100 is not linearly related to input signal z as shown in Equation (1.10). To achieve linearity and to eliminate crosstalk in MIMO transmitter 100, digital predistorting techniques can be used to compensate for the distortions. With digital predistorting techniques, the input data streams in MIMO transmitter 100 are modified before entering pre-amplifier components 104 in anticipation of the distortions to be introduced in the RF components 102 and 106 and the power amplifiers 104. In other words, the modified data streams are "predistorted". When the predistorted data streams pass through MIMO transmitter 100, the predistorted data streams are distorted by crosstalk and non-linearities of the power amplifiers 104. The goal of digital predistorting techniques is to cancel the distortions with the predistortions introduced on purpose and, as a result, output data streams y are again linearly related to the input data streams z, as would be in an ideal transmitter.

Figure 3:
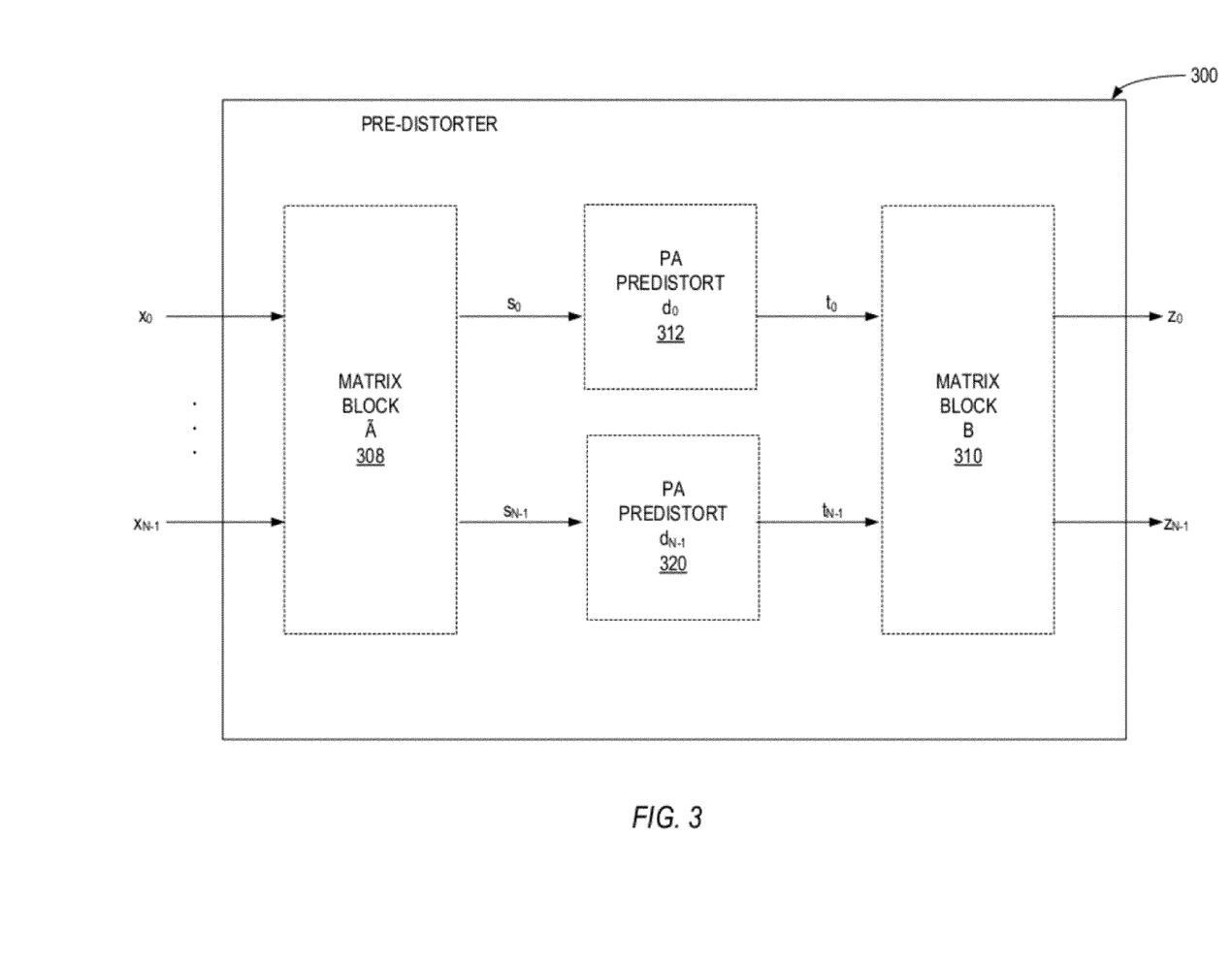
FIG. 3 illustrates an exemplary embodiment of a digital predistorter.

FIG. 3 illustrates an embodiment of a digital predistorter 300. The digital predistorter 300 converts input data streams x into output data streams z for input to MIMO transmitter 100. The digital predistorter 300 includes a first matrix block 308, a second matrix block 310, and a plurality of PA predistorters 312, ..., 320. As input data streams x pass through matrix block A, they are converted into data streams s. Afterwards, each PA predistorter 312, ..., 320, converts $s_i$ in data streams s into $t_i$. Matrix block B then converts data streams t into data streams z.

Matrix blocks 308 and 310 are digital circuits implementing matrix operations. Specifically, matrix block 308 multiples the input data streams x by matrix $\tilde{A}$. $\tilde{A}$ is an inversion of matrix A whose elements represent post-amplifier crosstalk as shown in Equation (1.8). Matrix block 310 multiplies the input data streams t by $\tilde{B}$. $\tilde{B}$ is an inversion of matrix B whose elements represent pre-amplifier crosstalk as shown in Equation (1.3).

The digital predistorter 300 also includes a plurality of PA predistorters whose predistorting effects are represented mathematically by the array of functions:

$$d = [d_0(\cdot), d_1(\cdot), \ldots, d_{N-1}(\cdot)]^T \quad (1.11),$$

where $d_i$ represents a non-linear function designed to compensate for the non-linearity introduced by the i-th amplifier Function $d_i$ transforms data signal $s_i$ into data signal $t_i$:

$$t_i = d_i(s_i), i = 0, 1, \ldots, N-1 \quad (1.12).$$

When data streams s enter the digital predistorter 300, matrix block 308 converts data streams x into data streams s. Data streams s are related to input data streams x as:

$$\underset{N \times 1}{s} = \underset{N \times N}{\tilde{A}} \cdot \underset{N \times 1}{x}. \quad (1.13)$$

Data streams x pass through the PA predistorters 312, ..., 320 and are transformed into data streams t. Data streams t are related to data streams s as:

$$\underset{N \times 1}{t} = d(\underset{N \times 1}{s}). \quad (1.14)$$

Matrix block 310 further transforms data streams t into the final output data streams z, which can be expressed as:

$$\underset{N \times 1}{z} = \underset{N \times N}{\tilde{B}} \cdot \underset{N \times 1}{t}. \quad (1.15)$$

Substituting Equations (1.13) and (1.14) into Equation (1.15) gives:

$$\underset{N \times 1}{z} = \underset{N \times N}{\tilde{B}} \cdot d\left(\underset{N \times N}{\tilde{A}} \cdot \underset{N \times 1}{x}\right). \quad (1.16)$$

Assuming that MIMO transmitter 100 and digital predistorter 300 do not exhibit any memory effect, the output signals y from MIMO transmitter 100 can be derived from the input data stream x via Equations (1.9) and (1.16) as:

$$\underset{N \times 1}{y} = \underset{N \times N}{A} \cdot f\left(\underset{N \times N}{B} \cdot \underset{N \times N}{\tilde{B}} \cdot d\left(\underset{N \times N}{\tilde{A}} \cdot \underset{N \times 1}{x}\right)\right). \quad (1.17)$$

Because $B \cdot \tilde{B} = I$, I being an identity matrix, Equation (1.14) can be simplified as:

$$\underset{N \times 1}{y} = \underset{N \times N}{A} \cdot f\left(d\left(\underset{N \times N}{\tilde{A}} \cdot \underset{N \times 1}{x}\right)\right). \quad (1.18)$$

For each PA predistorter, 312, ..., 320, $d_i$ is designed to compensate the non-linear effect introduced by $PA_i$ which is represented as a function $f_i$. Therefore, the array of functions, d, should be designed such that $f(d(\ ))$ represents a linear gain function $diag(g)$. As such, Equation (1.18) can be further simplified as:

$$\underset{N \times 1}{y} = \underset{N \times N}{A} \cdot \left(diag(g)\left(\underset{N \times N}{\tilde{A}} \cdot \underset{N \times 1}{x}\right)\right). \quad (1.19)$$

Because $A \cdot \tilde{A} = I$, I being an identity matrix, Equation (1.19) can be simplified as:

$$\underset{N \times 1}{y} = \underset{N \times N}{diag(g)}(\underset{N \times 1}{x}). \quad (1.20)$$

In Equation (1.20), output data streams y from MIMO transmitter 100 are linearly related to input data streams x.

Input data streams x are the input data signals that digital predistorter 300 takes and uses to generate predistorted data streams z, which are then input into MIMO transmitter 100. Data streams z experience crosstalk and non-linear PA distortions as z pass through MIMO transmitter 100. Equation (1.20) shows that output data streams y of MIMO transmitter 100 are a linear copy of the input data streams x, that is, the predistortion introduced by digital predistorter 300 cancels out the crosstalk and non-linear PA distortions introduced by MIMO transmitter 100. This is one of the functions that the predistorter 300 is designed to achieve.

So far, in describing MIMO transmitter 100 and digital predistorter 300, the memory effects have been ignored and the indices that represent time intervals have been omitted. Generally crosstalk does not exhibit memory effects. Algorithms implemented in PA predistorters 312, ..., 320, can incorporate memory effects. In such case, Equation (1.20) would still hold, albeit approximately, as shown in Equation:

$$\underset{N\times 1}{y} \approx diag(\underset{N\times N}{g})(\underset{N\times 1}{x}). \quad (1.21)$$

Figure 4:
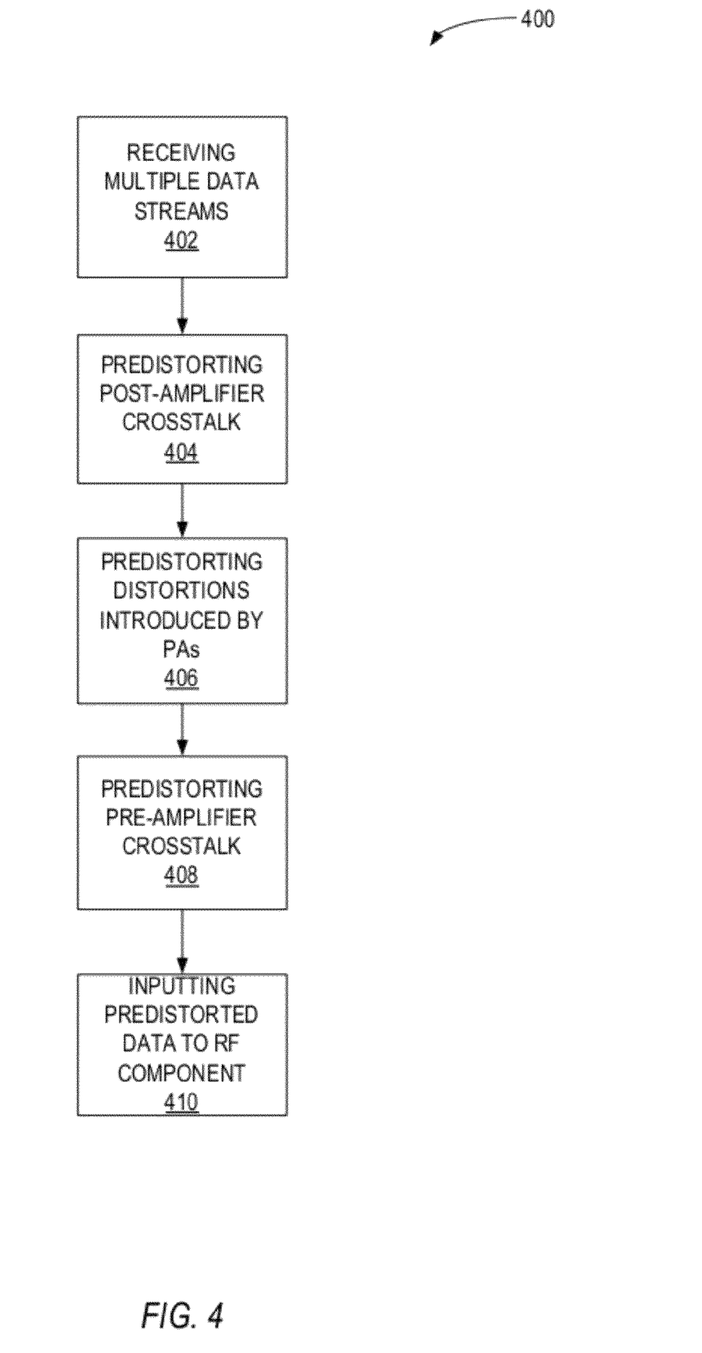
FIG. 4 illustrates a flow diagram showing an exemplary predistorting process in a MIMO transmitter.

FIG. 4 illustrates a predistorting process 400 implemented in digital predistorter 300. Digital predistorter 300 receives multiple data streams on respective transmit paths (block 402). The multiple data streams are predistorted to compensate for post-amplifier crosstalk between the multiple transmit paths (block 404). After the post-amplifier crosstalk has been compensated, digital predistorter 300 predistorts each data stream separately to compensate for distortions introduced by the respective power amplifier (block 406). Digital predistorter 300 operates on the data streams to compensate for pre-amplifier crosstalk (block 408). The output data from digital predistorter 300 is then input into MIMO transmitter 100.

Figure 5:
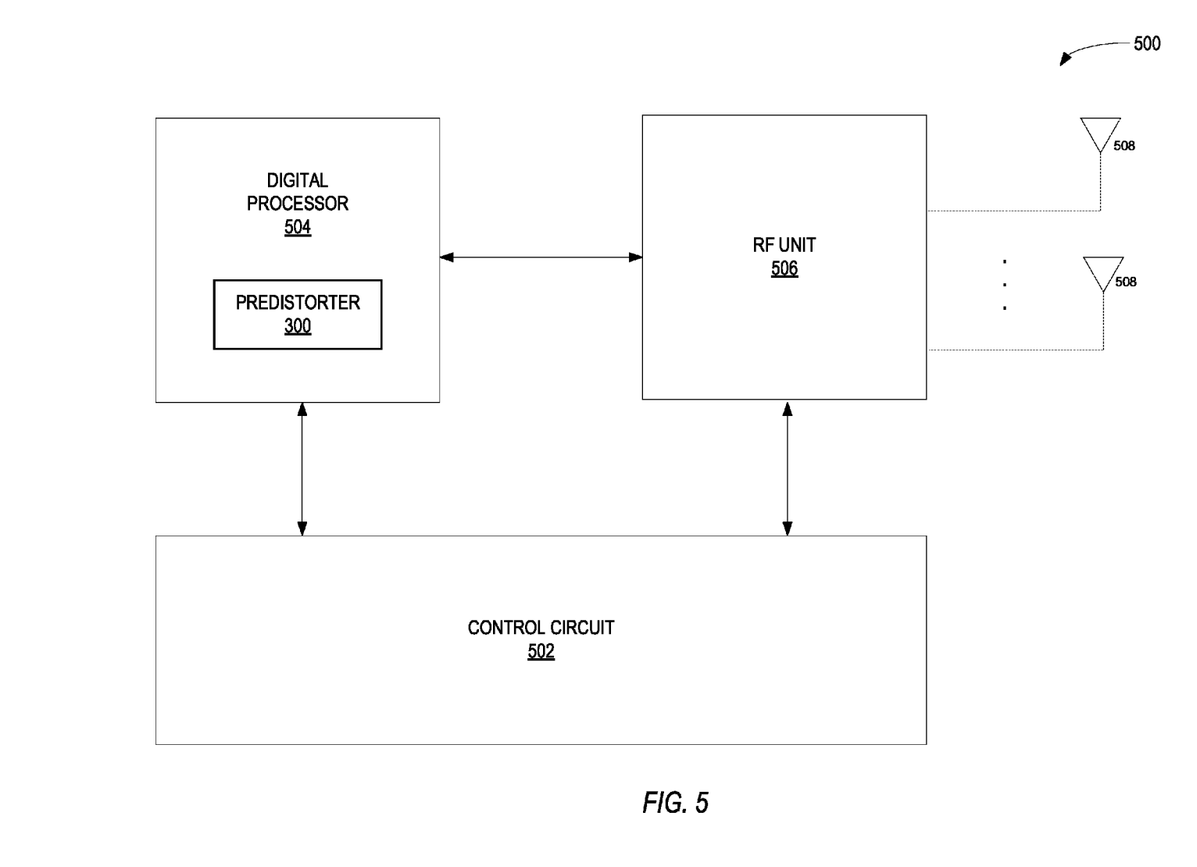
FIG. 5 illustrates a schematic diagram showing the different components of an exemplary MIMO transmitter.

FIG. 5 is a schematic diagram 500 illustrating the interworking of a digital predistorter 300 and MIMO transmitter 100. Digital processor 504 includes a digital predistorter 300. Digital predistorter 300 predistorts the input data streams before the data streams are transmitted to a RF unit 506. RF unit 506 comprises a plurality of transmit paths. For each transmit path, RF unit 506 further comprises a pre-amplifier RF component, a post-amplifier RF component, and a power amplifier as shown in FIG. 1. RF unit 506 also includes multiple antennas 508. RF unit 506 receives and transmits data through antennas 508. RF unit 506 also transmits and receives data streams to and from digital processor 504. Control circuit 502 shown in FIG. 5 controls both digital processor 504 and RF unit 506 according the communication standards implemented in the communication system.

The present invention may be carried out in other specific ways than those herein set forth without departing from the scope and essential characteristics of the invention. One or more of the specific processes discussed above may be carried out in a cellular phone or other communications transceiver comprising one or more appropriately configured processing circuits, which may in some embodiments be embodied in one or more application-specific integrated circuits (ASICs). In some embodiments, these processing circuits may comprise one or more microprocessors, microcontrollers, and/or digital signal processors programmed with appropriate software and/or firmware to carry out one or more of the operations described above, or variants thereof. In some embodiments, these processing circuits may comprise customized hardware to carry out one or more of the functions described above. The present embodiments are, therefore, to be considered in all respects as illustrative and not restrictive, and all changes coming within the meaning and equivalency range of the appended claims are intended to be embraced therein.

The invention claimed is:

1. A method for compensating for distortions introduced in data streams during transmission thereof in a multi-antenna transmitter, the multi-antenna transmitter having a plurality of transmit paths coupled to respective transmit antennas, each transmit path including a power amplifier for amplifying a respective data stream, said method comprising:
    predistorting the data streams to compensate for post-amplifier crosstalk between the plurality of transmit paths occurring after the power amplifiers;
    after compensating for post-amplifier crosstalk, predistorting the data streams to compensate for non-linear distortions introduced by the power amplifiers;
    after compensating for distortions at the power amplifiers, predistorting the data streams to compensate for pre-amplifier crosstalk between the plurality of transmit paths occurring before the amplifiers; and
    transmitting each of the pre-distorted multiple data streams from a respective transmit antenna.

2. The method of claim 1, wherein the predistorting of the data streams to compensate for non-linear distortions introduced by the power amplifiers comprises predistorting each of the multiple data streams separately to compensate for non-linear effects introduced by the respective power amplifier.

3. The method of claim 1, wherein the predistorting of the data streams to compensate for post-amplifier crosstalk comprises multiplying a vector of input data symbols by a first matrix whose elements represent the post-amplifier crosstalk between the different transmit paths.

4. The method of claim 1 wherein the predistorting of the data streams to compensate for pre-amplifier crosstalk comprises multiplying a vector of data symbols by a second matrix whose elements represent the pre-amplifier crosstalk effects between the transmit paths.

5. A predistortion circuit for a multi-antenna transmitter to correct distortions in multiple data streams introduced during transmission, said multi-antenna transmitter comprising multiple transmit paths coupled to respective transmit antennas and a plurality of power amplifiers to amplify data streams on the respective transmit paths, said predistortion circuit comprising:
    a first crosstalk predistorter to compensate for post-amplifier crosstalk between the different transmit paths occurring after the plurality of power amplifiers;
    one or more amplifier predistorters coupled to the first crosstalk predistorter to compensate for distortions introduced by the plurality of power amplifiers; and
    a second crosstalk predistorter coupled to the one or more amplifier predistorters to compensate for pre-amplifier crosstalk between the multiple transmit paths occurring before the plurality of power amplifiers.

6. The predistortion circuit of claim 5, wherein the one or more amplifier predistorterspredistort each data stream separately to compensate for non-linear distortions introduced by respective power amplifiers.

7. The predistortion circuit of claim 5, wherein the first crosstalk predistorter multiplies a vector of input data symbols by a first matrix whose elements represent the post-amplifier crosstalk effects.

8. The predistortion circuit of claim 5 wherein the second crosstalk predistorter multiplies a vector of data symbols by a second matrix whose elements represent the pre-amplifier crosstalk effects.

* * * * *